US012658400B2

(12) United States Patent
Sacco et al.

(10) Patent No.: US 12,658,400 B2
(45) Date of Patent: Jun. 16, 2026

(54) ION SOURCE

(71) Applicant: NISSIN ION EQUIPMENT CO., LTD., Koka-city (JP)

(72) Inventors: George Sacco, Groveland, MA (US); Sami K. Hahto, Nashua, NH (US)

(73) Assignee: NISSIN ION EQUIPMENT CO., LTD., Koka-city (JP)

( * ) Notice: Subject to any disclaimer, the term of this patent is extended or adjusted under 35 U.S.C. 154(b) by 104 days.

(21) Appl. No.: 18/673,795

(22) Filed: May 24, 2024

(65) Prior Publication Data

US 2025/0364205 A1     Nov. 27, 2025

(51) Int. Cl.
H01J 37/08     (2006.01)
H01J 37/317     (2006.01)

(52) U.S. Cl.
CPC ........... H01J 37/08 (2013.01); H01J 37/3171 (2013.01)

(58) Field of Classification Search
None
See application file for complete search history.

(56) References Cited

U.S. PATENT DOCUMENTS

| | | | | |
|---|---|---|---|---|
| 4,730,111 A | * | 3/1988 | Vestal | G01N 30/7253 250/281 |
| 4,814,612 A | * | 3/1989 | Vestal | H01J 49/0486 250/288 |

| | | | | |
|---|---|---|---|---|
| 4,845,366 A | * | 7/1989 | Hoffman | H01J 37/08 250/425 |
| 4,847,504 A | * | 7/1989 | Aitken | H01J 37/3171 250/492.1 |
| 4,861,989 A | * | 8/1989 | Vestal | H01J 49/0486 250/281 |
| 4,960,992 A | * | 10/1990 | Vestal | G01N 30/7253 73/864.81 |
| 4,968,885 A | * | 11/1990 | Willoughby | H01J 49/045 73/864.81 |
| 5,030,826 A | * | 7/1991 | Hansen | H01J 49/0445 250/281 |
| 5,235,186 A | * | 8/1993 | Robins | G01N 30/7266 250/281 |
| 5,285,064 A | * | 2/1994 | Willoughby | H01J 49/049 73/864.81 |
| 5,343,047 A | * | 8/1994 | Ono | H01J 37/3171 250/398 |
| 5,420,437 A | * | 5/1995 | Siess | C23C 16/44 250/492.3 |
| 5,604,350 A | * | 2/1997 | Chu | H01J 27/022 250/426 |
| 5,675,152 A | * | 10/1997 | Wong | H01J 27/08 315/111.81 |
| 5,998,798 A | * | 12/1999 | Halling | H01J 37/3171 250/252.1 |
| 6,627,901 B2 | | 9/2003 | Martinez | |
| 7,834,554 B2 | * | 11/2010 | Horsky | H01J 27/08 315/111.81 |

(Continued)

*Primary Examiner* — Srinivas Sathiraju
(74) *Attorney, Agent, or Firm* — Sughrue Mion, PLLC

(57) ABSTRACT

An ion source includes a vaporizer having a nozzle, and a plasma generation chamber having a projection portion that projects into the plasma generation chamber. The projection portion receives an end portion of the nozzle and includes one or more apertures in fluid communication with an interior of the plasma generation chamber.

17 Claims, 16 Drawing Sheets

(56)                References Cited

U.S. PATENT DOCUMENTS

| | | | | |
|---|---|---|---|---|
| 7,838,842 B2* | 11/2010 | Horsky | ................ | H01L 21/265 |
| | | | | 315/111.81 |
| 8,193,513 B2* | 6/2012 | DiVergilio | .............. | H01J 37/08 |
| | | | | 250/425 |
| 9,576,767 B2* | 2/2017 | Bhattacharjee | ......... | H01J 37/08 |
| 9,741,537 B1 | 8/2017 | Kao et al. | | |
| 9,773,637 B2* | 9/2017 | Oba | ........................ | H01J 37/08 |
| 9,773,646 B2* | 9/2017 | Oba | ...................... | H01J 37/321 |
| 9,852,879 B2* | 12/2017 | Kamiya | ................. | H01J 37/08 |
| 10,573,490 B2* | 2/2020 | Yamamoto | ......... | H01J 37/1472 |
| 10,600,608 B1* | 3/2020 | Adachi | ................... | H01J 27/22 |
| 10,763,073 B2* | 9/2020 | Yamamoto | ............. | H01J 37/08 |
| 12,112,915 B2* | 10/2024 | Hahto | .................... | H01J 37/08 |
| 12,328,807 B2* | 6/2025 | Sacco | .................. | H01J 49/105 |
| 2002/0008451 A1* | 1/2002 | Gibson | ................ | H01J 37/321 |
| | | | | 313/231.31 |
| 2002/0070672 A1* | 6/2002 | Horsky | .............. | H01J 37/3171 |
| | | | | 257/E21.336 |
| 2004/0000647 A1* | 1/2004 | Horsky | ............. | H10D 30/0223 |
| | | | | 250/427 |
| 2005/0061989 A1* | 3/2005 | Taniguchi | .............. | H01J 37/08 |
| | | | | 250/425 |
| 2006/0097193 A1* | 5/2006 | Horsky | ............. | H10D 30/0227 |
| | | | | 257/E21.336 |
| 2006/0097645 A1* | 5/2006 | Horsky | .............. | H01L 21/2658 |
| | | | | 257/E21.336 |
| 2007/0170372 A1* | 7/2007 | Horsky | .................. | H01J 27/08 |
| | | | | 250/427 |
| 2007/0210260 A1* | 9/2007 | Horsky | ................ | C23C 14/564 |
| | | | | 250/424 |
| 2008/0042580 A1* | 2/2008 | Horsky | ............ | H01L 21/26566 |
| | | | | 315/111.81 |
| 2008/0087219 A1* | 4/2008 | Horsky | .............. | H01J 37/3171 |
| | | | | 118/698 |
| 2009/0183679 A1* | 7/2009 | McIntyre | ................ | H01J 37/08 |
| | | | | 118/723 CB |
| 2012/0252195 A1* | 10/2012 | Jones | ..................... | C23C 14/52 |
| | | | | 257/E21.334 |
| 2014/0265854 A1* | 9/2014 | Horsky | ................ | H01J 27/205 |
| | | | | 315/111.21 |
| 2015/0179393 A1* | 6/2015 | Colvin | ................... | H01J 37/08 |
| | | | | 250/427 |
| 2016/0240346 A1* | 8/2016 | Oba | ........................ | H01J 37/08 |
| 2016/0240354 A1* | 8/2016 | Oba | ........................ | H01J 27/16 |
| 2018/0174807 A1* | 6/2018 | Lin | ....................... | H01L 21/265 |
| 2019/0318904 A1* | 10/2019 | Yamamoto | ............. | H01J 37/05 |
| 2019/0326089 A1* | 10/2019 | Yamamoto | ......... | H01J 37/3171 |
| 2023/0326702 A1* | 10/2023 | Hahto | .................... | H01J 37/08 |
| | | | | 250/423 R |
| 2023/0395357 A1* | 12/2023 | Wright | ................... | C23C 14/48 |
| 2024/0098869 A1* | 3/2024 | Sacco | ................ | H01J 37/3171 |
| 2025/0079113 A1* | 3/2025 | Wright | .............. | H01J 37/3171 |
| 2025/0125119 A1* | 4/2025 | Fish | ....................... | H01J 37/08 |
| 2025/0273437 A1* | 8/2025 | Sacco | ............. | H01J 37/32412 |

* cited by examiner

ION SOURCE

BACKGROUND

1. Field

The present disclosure relates to an ion source that supplies vapor from a vaporizer to a plasma generation chamber and extracts an ion beam from the plasma generation chamber.

2. Description of Related Art

In an ion source used in an ion implantation apparatus, a vaporizer is used mainly for producing metal ions. The vaporizer receives a solid metal in a crucible and raises the crucible temperature to produce a metal vapor. The generated vapor is supplied to the plasma generation chamber through a nozzle attached to the crucible.

In the plasma generation chamber, a plasma is generated from the supplied vapor, and an ion beam is extracted from the generated plasma.

SUMMARY

According to an aspect of one or more embodiments, there is provided an ion source comprising a vaporizer comprising a nozzle; and a plasma generation chamber that receives a vapor from the vaporizer through the nozzle. The nozzle is located outside the plasma generating chamber, the plasma generation chamber has a first wall and a second wall that is opposite to the first wall, the second wall has a first portion and a second portion which are at different positions from each other in a direction from the first wall to the second wall, and a third portion provided between the first portion and the second portion, and at least one of the second portion or the third portion has at least one aperture through which the vapor from the vaporizer enters into the plasma generation chamber.

According to another aspect of one or more embodiments, there is provided an ion source comprising a vaporizer comprising a nozzle and configured to generate a vapor; and a plasma generation chamber that receives the vapor from the nozzle. The nozzle is located outside the plasma generating chamber, the plasma generation chamber has a first wall and a second wall that is opposite to the first wall, the second wall has a projection portion that projects toward the first wall, and the projection portion receives the nozzle and has at least one aperture through which the vapor is supplied into the plasma generation chamber.

According to yet another aspect of one or more embodiments, there is provided an ion source comprising a vaporizer comprising a nozzle; and a plasma generation chamber comprising a first wall having an ion extraction port, and a second wall that includes a projection portion that projects into the plasma generation chamber to form a recess in which an end portion of the nozzle is received, the second wall being opposite to the first wall in an axial direction of the nozzle. The projection portion comprises at least one aperture in fluid communication with an interior of the plasma generation chamber.

BRIEF DESCRIPTION OF THE DRAWINGS

The above and/or other aspects will become apparent and more readily appreciated from the following description of various embodiments, taken in conjunction with the accompanying drawings, in which.

DETAILED DESCRIPTION

As used in this specification, the phrase "at least one of A or B" includes within its scope "only A", "only B", and "A and B".

In some related arts, a nozzle tip of a vaporizer, in other words an end portion of a nozzle of a vaporizer, is disposed flush with or inside an inner wall of a plasma generation chamber.

An operating state of the ion source varies depending on a beam current of an extracted ion beam and an ion species. When a power input during the operation of the ion source become large, a temperature of a plasma generated in the plasma generation chamber also becomes high.

However, in the related art nozzle in which a tip thereof is disposed flush with or inside the inner wall of plasma generation chamber, there is a disadvantage in that the nozzle tip is eroded and deformed by exposure to the high-temperature plasma. This erosion and deformation makes it difficult to perform a vapor supply continuously, and it is necessary to stop the operation of the ion source and replace the nozzle. Such replacement of the nozzle reduces operation rate of the ion source. Therefore, it is advantageous to provide an ion source capable of performing continuous vapor supply regardless of the operating state of the ion source.

Figure 1:
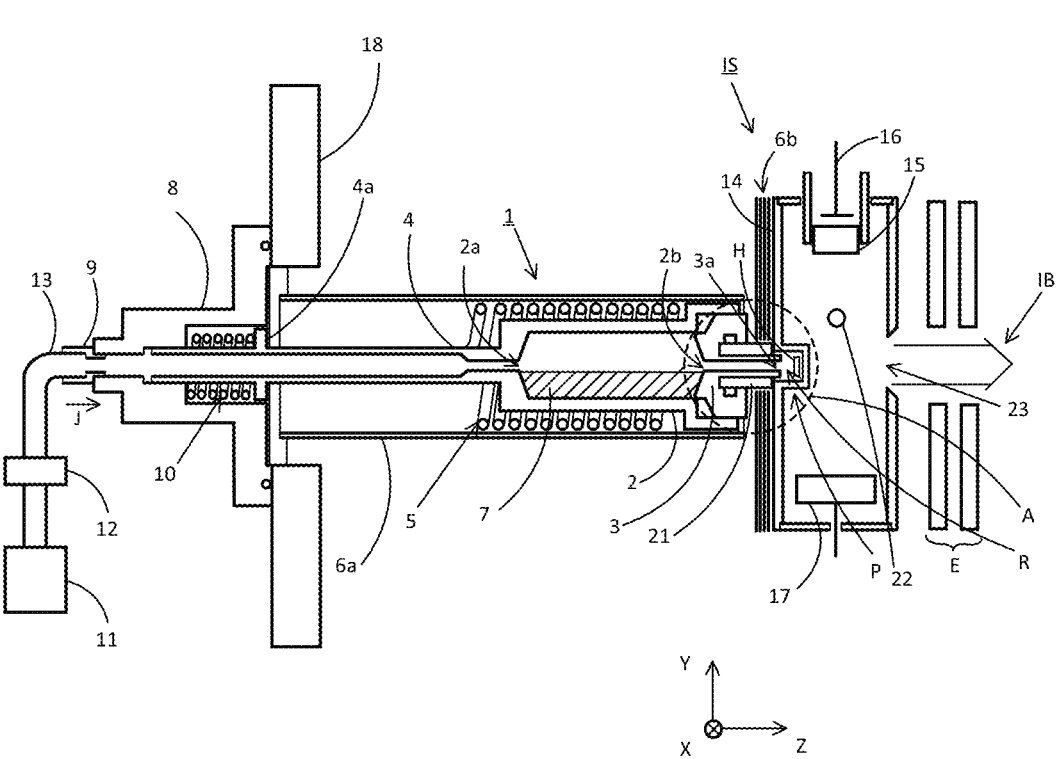
FIG. 1 is a schematic cross-sectional view of an example of an ion source, according to some embodiments.

FIG. 1 shows a schematic cross section of an example of an ion source IS, according to some embodiments. The ion source IS is illustrated as an indirectly heated cathode (IHC) ion source by way of example. However, embodiments are not limited to an IHC ion source. A filament 16 heats a cathode 15 and the cathode 15 emits ionizing electrons inside of plasma generation chamber 14. The plasma generation chamber 14 is a container that may have a substantially rectangular parallelepiped or a substantially cubic shape. A reflecting electrode 17 is positioned opposite the cathode 15 to repel electrons from the cathode 15. An external electromagnet, which is not shown in FIG. 1, generates a magnetic field along a direction connecting the cathode 15 and the reflecting electrode 17.

For example, aluminum-containing vapor may be supplied from a vaporizer 1 to inside of the plasma generation chamber 14. Plasma is generated in the plasma generation chamber 14 based on the aluminum-containing vapor. An ion beam IB or ion beams containing aluminum ions is extracted through an ion extraction port 23 of the plasma generation chamber 14 by extraction electrodes E. In FIG. 1, two circularly shaped extraction electrodes E with a hole through which the ion beam IB passes in the center are illustrated, but the number and shape of the extraction electrodes E is exemplary and, in some embodiments, the number and/or shape of the extraction electrodes E may be changed.

In some embodiments, the number of extraction electrodes may be more or less than two. In general, the number of extraction electrodes may be modified according to a configuration of an ion source.

The vaporizer 1 includes a crucible 2. The crucible 2 in FIG. 1 is a cylindrical member that is long in one direction. For example, a central axis of the crucible 2 may extend along a longitudinal direction (e.g., along the Z direction in FIG. 1) of the crucible 2. An outlet 2b for supplying aluminum-containing vapor and reactive gas to the plasma generation chamber 14 is disposed at one end of the crucible 2 in the longitudinal direction. An inlet 2a for supplying the reactive gas such as chlorine-containing gas into the crucible 2 is disposed at the other end of the crucible 2 in the longitudinal direction. A part of the crucible 2 may be formed by a first nozzle 3 at the outlet 2b side.

In some embodiments, the chlorine-containing gas may be, for example, chlorine gas ($Cl_2$) or hydrogen chloride gas (HCl). The first nozzle 3 may be removably attached to the crucible 2. Various methods (e.g., fitting and/or screwing) can be used to attach the first nozzle 3 to the crucible 2. In the embodiment illustrated in FIG. 1, the crucible 2 and a second nozzle 4 for supplying reactive gas into the crucible 2 are formed in one piece.

The first nozzle 3 and the second nozzle 4 each have an elongated cylindrical shape. In some embodiments, the first nozzle 3, the second nozzle 4, and the crucible 2 are made of graphite. However, graphite is only one example, and in some embodiments, other materials may be used.

In FIG. 1, arrow J shows a flow of reactive gas supplied to the crucible 2. The reactive gas passes from a gas supply source 11 through a valve 12, through the second nozzle 4, the crucible 2, and the first nozzle 3 in that order, and enters the plasma generation chamber 14. The reactive gas reacts with a solid material 7 that is received in the crucible 2 and heated to a high temperature. In some embodiments, the solid material 7 may be an aluminum-containing solid material. This reaction between the solid material 7 and the reactive gas produces reaction products such as aluminum chloride ($AlCl_3$). The generated reaction products are vaporized in the crucible 2 to produce aluminum-containing vapor containing aluminum particles. The aluminum-containing vapor and chlorine-containing gas are supplied from the crucible 2 to the plasma generation chamber 14 via the first nozzle 3.

In some embodiments, the solid material 7 may be pure aluminum with a purity of 99.90% or higher. Pure aluminum increases the percentage of aluminum in the aluminum-containing vapor compared to other materials. As a result, the ion beam current of the ion beam containing aluminum ions extracted from the ion source IS is increased. However, the solid material 7 is not limited to pure aluminum. In some embodiments, aluminum nitride, aluminum oxide and/or other aluminum-containing solid materials may be used. As discussed further below, in some embodiments, the solid material 7 may include elements other than aluminum.

As shown in FIG. 1, a supply of reactive gas to the second nozzle 4 may be via a fitting member 9 that is in-fitted to the second nozzle 4. For example, in some embodiments, the reactive gas may be supplied from a gas supply source 11 configured to supply reactive gas. For example, the valve 12 may be a mass flow controller and may be connected to a pipe 13 that connects to the gas supply source 11 to the fitting member 9 and the valve 12 may control the flow rate of the reactive gas. However, the specific configuration for gas supply is not limited as long as the reactive gas can be supplied to the fitting member 9.

In some embodiments, the temperature of the crucible 2 may be a melting point or more than a melting point of the solid material 7 to increase the generation of reaction products and the vaporization of the reaction products and to prevent clogging of the first nozzle 3 and the second nozzle 4.

In some embodiments, the solid material 7 may be in the form of a powder, pellets, and/or a block. In some embodiments, the solid material 7 may be, for example, pure aluminum, aluminum nitride, or aluminum oxide, or other aluminum containing materials including a powder. However, embodiments are not limited to this and, in some embodiments, the solid material 7 may be changed depending on a metal ion species to be generated.

In some embodiments, the plasma generation chamber 14 may have a gas port 22 to receive various gases instead of vapor.

An end portion 3a of the first nozzle 3, opposite from the end of the first nozzle 3 attached to the crucible 2, may be disposed outside the plasma generation chamber 14. The plasma generation chamber 14 may have a projection portion P projecting to the inside of the plasma generation chamber 14. A space R for receiving a vapor is formed inside the projection portion P. For example, the space R may also be referred to as a recess. In other words, in some embodiments, a distal end of the end portion 3a may be spaced apart from a distal end DS of the projection portion P to define a gap G therebetween. In some embodiments, the gap G may be provided between a cylindrical side surface of the first nozzle and an interior side surface of the projection portion P (i.e., an interior side surface of the second wall portion 14b2 described below).

Figure 2:
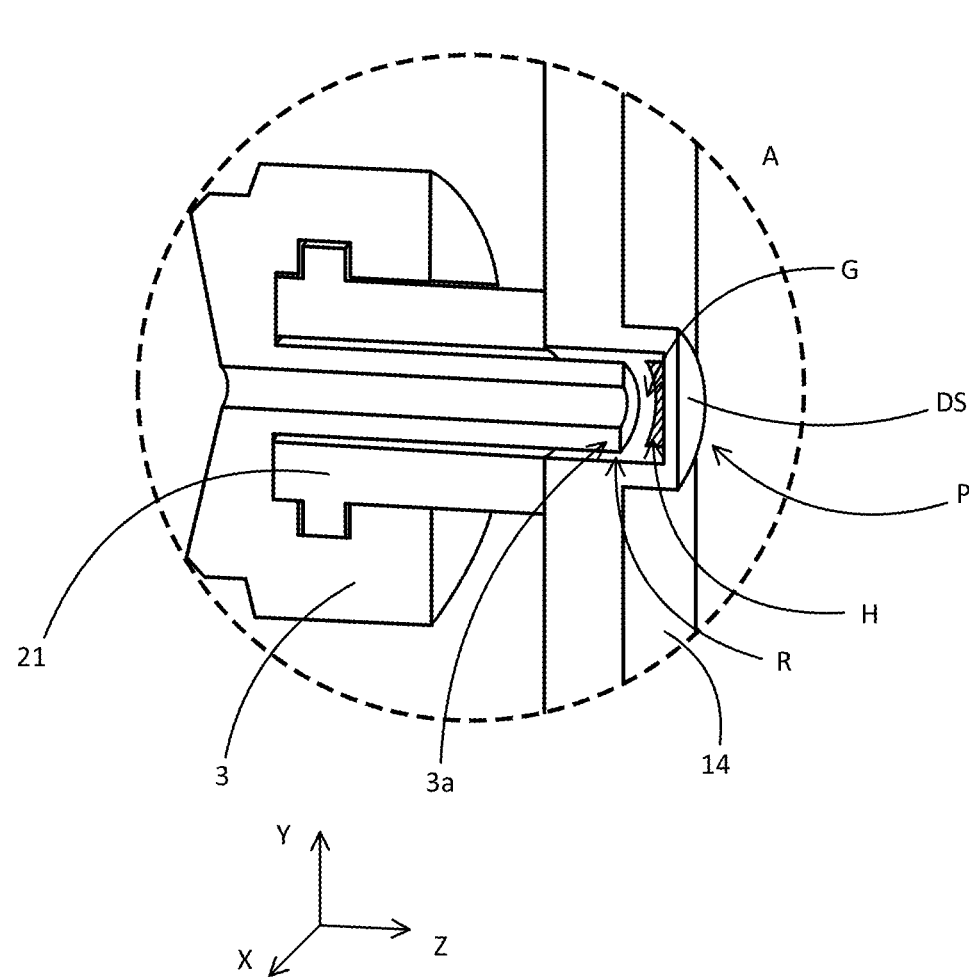
FIG. 2 shows an enlarged view of A region shown in FIG. 1, according to some embodiments.

FIG. 2 is an enlarged view of region A in FIG. 1, according to some embodiments. In FIG. 2, for simplification of illustrations, the second heat shield 6b, the crucible 2, and other parts in FIG. 1 are not shown. As shown in FIG. 2, the end portion 3a of the first nozzle 3 is disposed in the space R formed inside the projection portion P. The wall surface of the plasma generation chamber 14 forming the projection portion P has at least one aperture H in fluid communication with the inside and the outside of the plasma generation chamber 14.

The aluminum-containing vapor flows from the end portion 3a of the first nozzle 3 into the space R, passes through the aperture H, and is supplied into the plasma generation chamber 14.

By disposing the end portion 3a of the first nozzle 3 outside the plasma generation chamber 14, it is possible to prevent the end portion 3a from being eroded by the high-temperature plasma. This configuration makes it possible to continuously supply vapor during the ion source operation.

Referring again to FIG. 1, a heater 5 may be wound around a periphery of the crucible 2. The solid material 7 is heated to a high temperature by the heater 5 and reacts with the reactive gas to generate the aluminum-containing vapor. In some embodiments, the heater 5 may be a coil heater. However, embodiments are not limited thereto and, in some embodiments, the heater 5 may have a different configuration such as a plate or other filament. A first heat shield 6a is placed around a periphery of the heater 5 to block heat radiation from the heater 5.

A temperature within the crucible 2 may vary from an ion source end of the crucible 2 (i.e., an end at which the first nozzle 3 is provided) to an opposite end of the crucible 2 (i.e., an end at which the second nozzle 4 is provided) due, at least in part, to heat that is generated by the plasma generation chamber 14 and transferred to an end of the crucible 2 near the plasma generation chamber 14.

Accordingly, in some embodiments, the ion source IS may be provided with a second heat shield 6b as illustrated in FIG. 1. The second heat shield 6b may be provided between the crucible 2 and a side wall of the plasma generation chamber 14 that faces the crucible 2, and may extend radially outward from the first nozzle 3 and parallel to the side wall of the plasma generation chamber 14. In some embodiments, the second heat shield 6b may be secured to the plasma generation chamber 14 by screws or other fittings. The second heat shield 6b may function to prevent heat from the plasma generation chamber 14 from heating the end of the crucible 2 that is near the plasma generation chamber 14.

In some embodiments, the second nozzle 4 may have a large diameter section 4a. In some embodiments, a flange 8 may be provided to attach the vaporizer 1 to an ion source flange 18. A coil spring 10 may be provided between the flange 8 and the large diameter section 4a of the second nozzle 4. The coil spring 10 forces the vaporizer 1 against a side wall of the plasma generation chamber 14 to prevent aluminum-containing vapor and/or the reactive gas from leaking out between the first nozzle 3 and the plasma generation chamber 14. In some embodiments, one or more gaskets (not shown) may also be provided between the vaporizer 1 and the side wall of the plasma generation chamber 14 to prevent gas leakage between the first nozzle 3 and the plasma generation chamber 14, and/or one or more gaskets (not shown) may be provided between the vaporizer 1 and the second heat shield 6b to prevent gas leakage between the vaporizer 1 and the second heat shield 6b.

In some embodiments, a damper, for example, a spring clip in the form of a snap ring, may be attached to the first nozzle 3 in order to avoid excess pressure by the elastic force of the coil spring 10. In some embodiments, a damper, for example, a spring clip, may be provided between the large diameter section 4a of the second nozzle 4 and the inner wall of the heat shield 6a in order to prevent the excess pressure by the elastic force of the coil spring 10. In some embodiments, one or all of one or more gaskets, a snap ring, and/or a spring clip may be provided. It is noted that the gaskets, snap ring and spring clip are only examples and, in other embodiments, different or additional structures may be used to prevent excess pressure. In some embodiments, the ion source flange 18 may also indirectly support the plasma generation chamber 14 and other components around the plasma generation chamber 14 such as the filament 16 and the cathode 15 by supporting parts not shown in FIG. 1.

In some embodiments, the solid material 7 may fill only a portion of the interior of the crucible 2. For example, in some embodiments, a top edge of the aluminum-containing solid material 7 may coincide with a bottom edge of the vapor outlet 2b or may lower than a bottom edge of the vapor outlet 2b.

The above description is provided using an example of an IHC ion source. However, an IHC source is only an example embodiment and, in other embodiments, other types of ion sources such as a Bernas ion source and a Radio frequency inductively coupled plasma ion source, etc. may be used as the ion source IS.

In some embodiments, the vaporizer 1 may include an insulator 21 that is provided to surround the first nozzle 3 that supplies the aluminum-containing vapor to the plasma generation chamber 14. In some embodiments, the second heat shield 6b may be omitted and the vaporizer 1 may include the insulator 21. In some embodiments, the insulator

21 may be formed of alumina ($Al_2O_3$). In some embodiments, the insulator 21 may be formed of boron nitride (BN). However, the material of the insulator 21 is not limited to these examples and, in some embodiments, another material that provides heat insulation may be used.

The insulator 21 may insulate the first nozzle 3 and the vapor outlet 2b from the heat produced by the plasma generation chamber 14. The insulator 21 may function to prevent heat from the plasma generation chamber 14 from heating the first nozzle 3 and the end of the crucible 2 that is near the plasma generation chamber 14.

Figure 3:
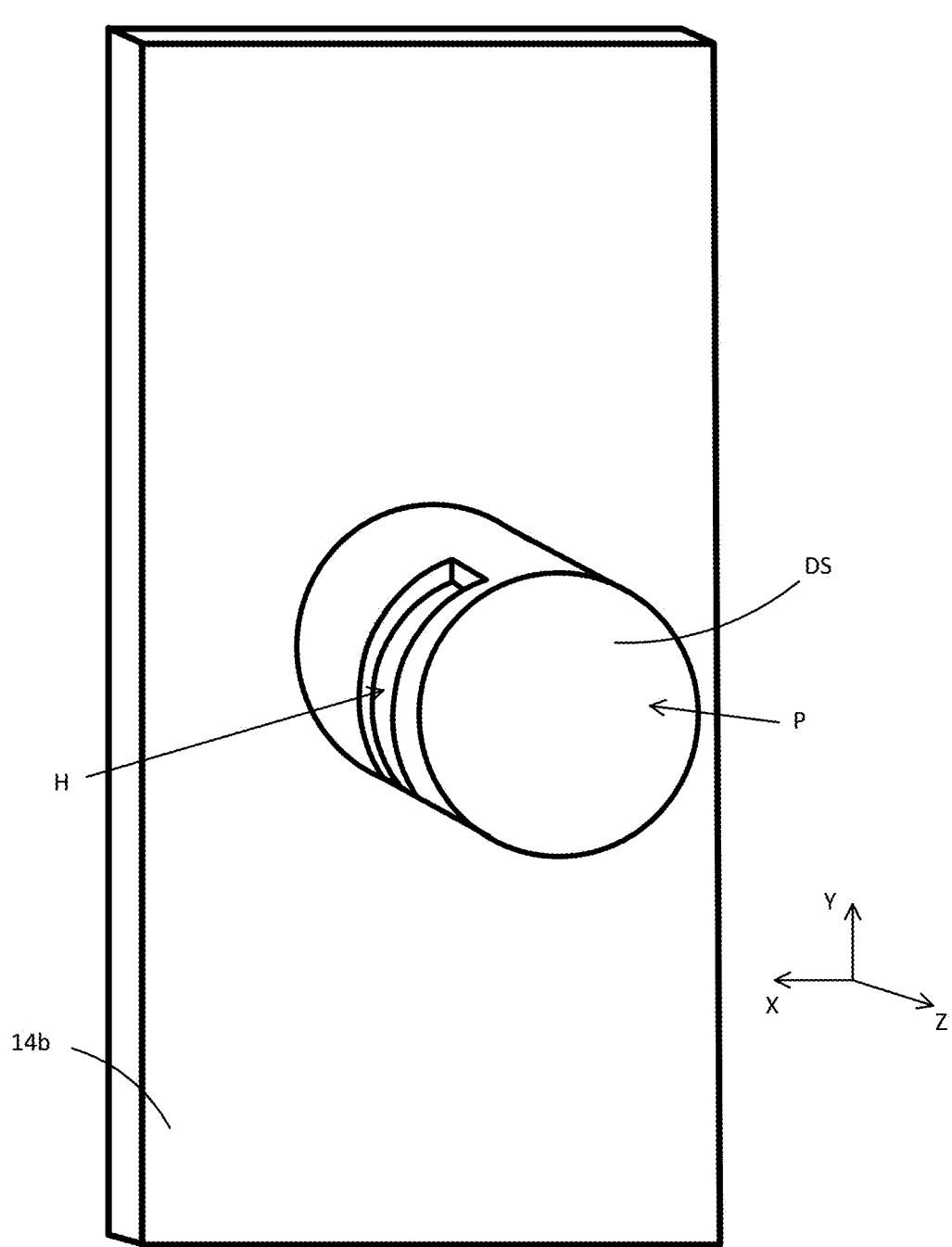
FIG. 3-4 illustrate an example of a wall surface of a plasma generation chamber having a projection portion, according to some embodiments.

FIG. 3 is a perspective view of a wall surface (a second wall 14b described later) of the plasma generation chamber 14 constituting the projection portion P shown in FIG. 1. The projection portion P may have a cylindrical shape with a distal surface DS on the Z-direction side. Two apertures H for releasing vapor are formed in a radial direction of the cylindrical projection portion P. For example, the two apertures H may be formed in opposite sides of the projection portion P in the X direction in FIG. 3. It is noted that only one aperture H may be seen in FIG. 3 due to the angle of the perspective view.

The number of the apertures H is not limited, and one aperture H or three or more aperture H may be provided. The position on the projection portion P at which the aperture(s) H is formed is not limited to the position illustrated in the configuration in FIGS. 1-3, and in some embodiments, two apertures H may be opposed to each other in the Y direction.

Figure 4:
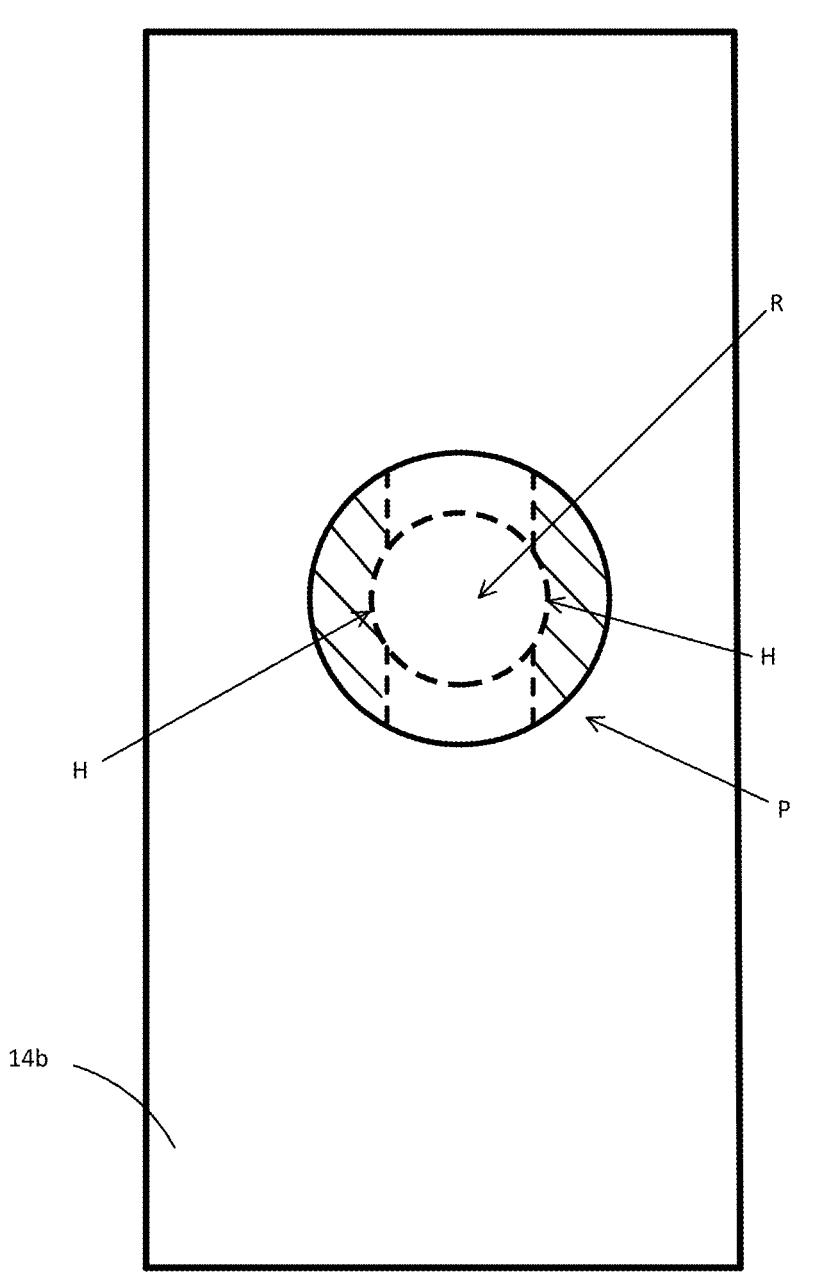

FIG. 4 is an XY plan view of the projection portion P shown in FIG. 3 when viewed from the front of the projection portion P, according to some embodiments. As shown in FIG. 4, the aperture H may be formed by linearly cutting out a part of the side surface of the projection portion P along the Y direction.

Figure 5:
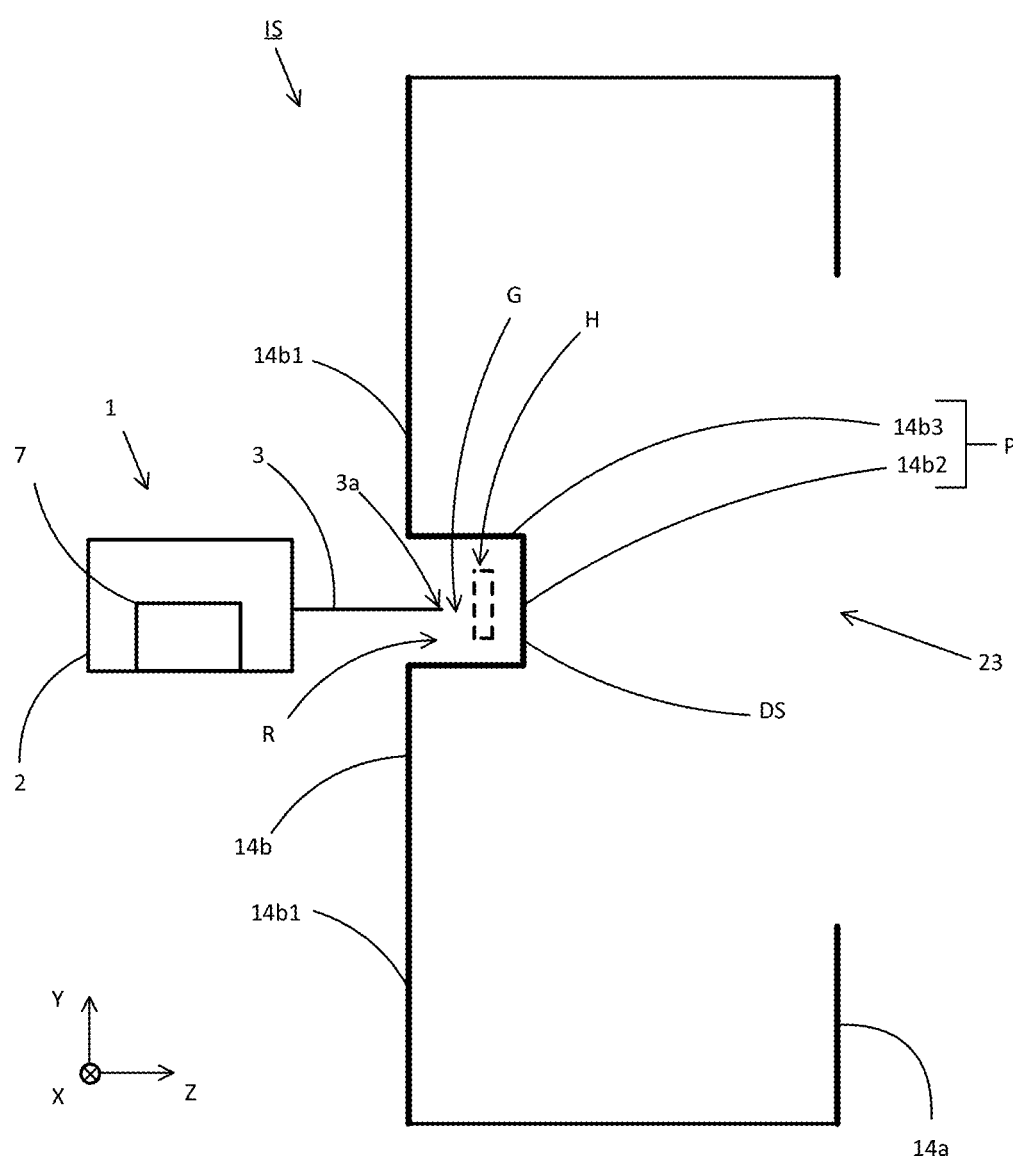
FIG. 5-11 illustrate schematic cross-sectional views of examples of an ion source, according to various embodiments.
Figure 6:
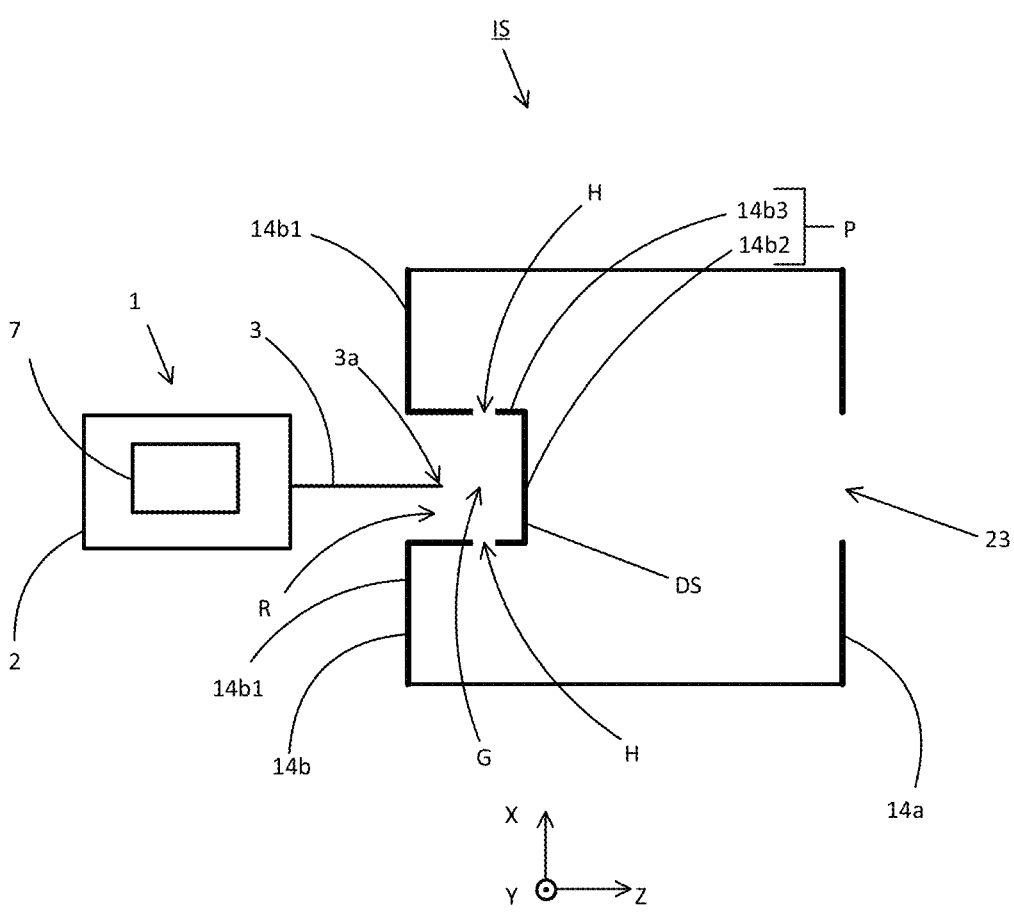

FIG. 5 shows a simplified configuration of the ion source IS shown in FIG. 1, according to some embodiments. FIG. 6 is a cross-sectional view of the ion source IS different from the plane of FIG. 5, according to some embodiments. The structure of the supply of the vapor from the vaporizer 1 to the plasma generation chamber 14 will be described in detail with reference to FIG. 5 and FIG. 6.

The plasma generation chamber 14 may have a first wall 14a and a second wall 14b which are opposed to each other. In the embodiment shown in FIG. 5 and FIG. 6, the first wall 14a has an ion extraction port 23 for extracting the ion beam IB.

The second wall 14b may have three portions. In some embodiments, the second wall 14b may have a first portion 14b1 and a second portion 14b2 which are different in position from each other in the opposing direction of the first wall 14a and the second wall 14b (direction parallel to the Z direction in these figures), and may have a third portion 14b3 between the first portion 14b1 and the second portion 14b2. In other words, the second portion 14b2 and the third portion 14b3 may define the recess R in the second wall 14b in the Z direction, as illustrated in FIG. 5. The recess may be cylindrical.

The second portion 14b2 and the third portion 14b3 correspond to the projection portion P in which the part of the plasma generation chamber 14 projects to the inside of the plasma generation chamber 14. In the embodiment illustrated in FIG. 5, an aperture H for supplying vapor is formed in the wall of the plasma generation chamber 14 constituting the third portion 14b3.

In some embodiments, the location where the aperture H is provided may include a plurality of open holes H in the circumferential direction of the projection portion P. In some embodiments, a plurality of apertures H may be formed in the axial direction of the projection portion P. In some embodiments, a plurality of apertures H may be formed in both circumferential and axial directions of the projection portion P.

The configuration in which the positions of the projection portions P in the circumferential direction may be different from each other. Another configuration in which the positions of the projection portions P in the axial direction may be different from each other. For convenience, the surface of the projection portion P on the Z-direction side is hereinafter referred to as a distal surface DS.

The aperture H may be formed not only on the side surface of the cylindrical projection portion P but also on the distal surface DS of the projection portion P. Of course, the aperture H may be formed only in one of the side surface of the cylindrical projection portion P and the distal surface DS of the projection portion P on the Z direction side.

Although there is no restriction on the location of the aperture H, it is advantageous that the location where the aperture H is formed is a location that does not face the ion extraction port 23 of the ion beam when the plasma generation efficiency in the plasma generation chamber 14 is taken into consideration.

A location that does not face the ion extraction port 23 is advantageous because the vapor supplied into the plasma generation chamber 14 through the aperture H is prevented from being released to the outside of the plasma generation chamber 14 through the ion extraction port 23 of the ion beam before the vapor is plasmatized in the plasma generation chamber 14. If such a release of the vapor occurs, efficiency of generating the plasma using the vapor is reduced.

The shape of the aperture H can be various shapes such as a rectangular shape, a circular shape, and a triangular shape in a plane view. The aperture H need not be formed along the circumferential direction of the projection portion P, but may be formed along the axial direction. The projection portion P may be formed on the side surface of the projection portion P in a direction oblique to the circumferential direction and the axial direction of the projection portion P.

As for the arrangement of the projection portion P, it is not necessary to arrange the projection portion P in the center of the wall (e.g., the second wall 14b) of the plasma generation chamber 14, and in some embodiments, the projection portion P may be arranged in an eccentric position from the center to the end side. For example, the projection portion P may be disposed in one of the X direction, the Y direction and the Z direction between the wall edge of the second wall 14b and the center of the second wall 14b.

In the embodiments of FIGS. 5 and 6, the third portion 14b3 is cylindrical. More specifically, the nozzle 3 is cylindrical or rectangular, and the distal surface DS is closed by the second portion 14b2, and the proximal surface is open so that the end portion 3a of the first nozzle 3 can be inserted and stored.

In the opposing direction of the first wall 14a and the second wall 14b, the position where the aperture H is formed is closer to the first wall 14a than the position where the end 3a of the first nozzle 3 is arranged. By this configuration, the vapor flowed from the end portion 3a of the first nozzle 3 can smoothly flow into the plasma generation chamber 14 through the aperture H.

However, this configuration is only an exemplary embodiment, and in some embodiments, the positional relationship between the end portion 3a of the first nozzle 3 and the place where the aperture H is formed may be opposite to the configurations shown in FIG. 5 and FIG. 6. That is, in the opposing direction of the first wall 14a and the second wall 14b, the position where the end 3a of the first nozzle 3 is arranged may be closer to the first wall 14a than the position where the aperture H is formed.

Figure 7:
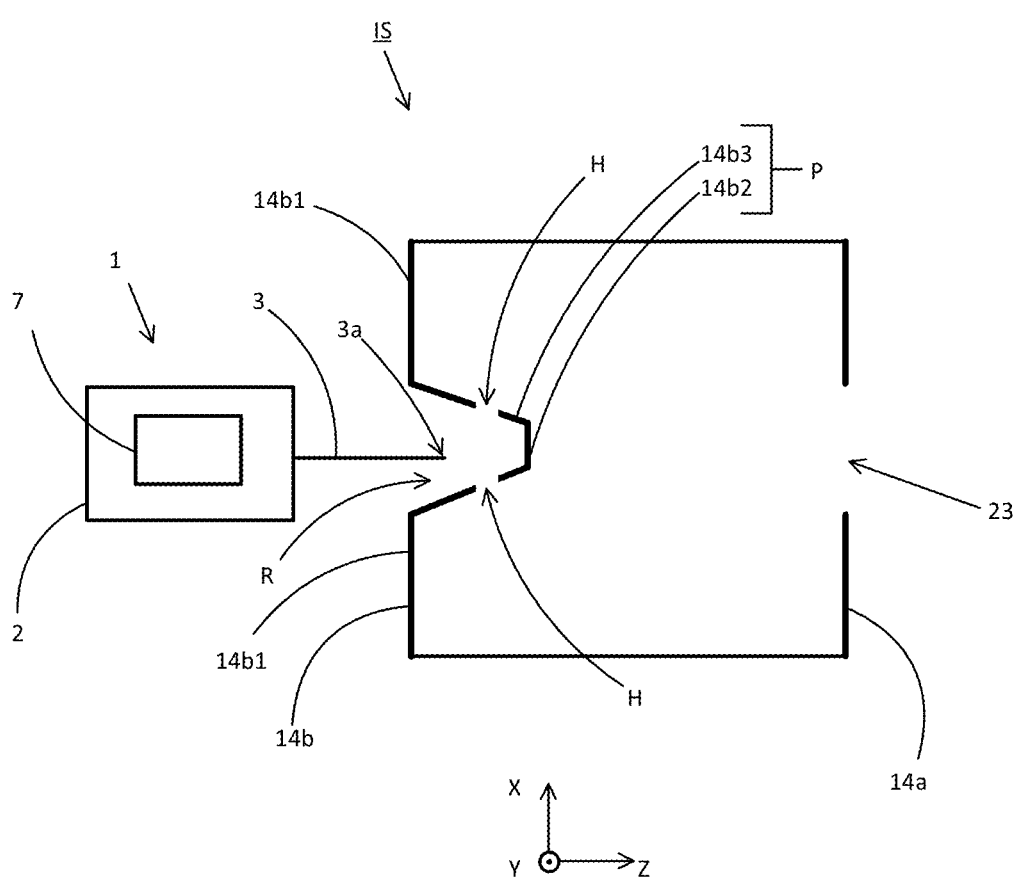
Figure 8:
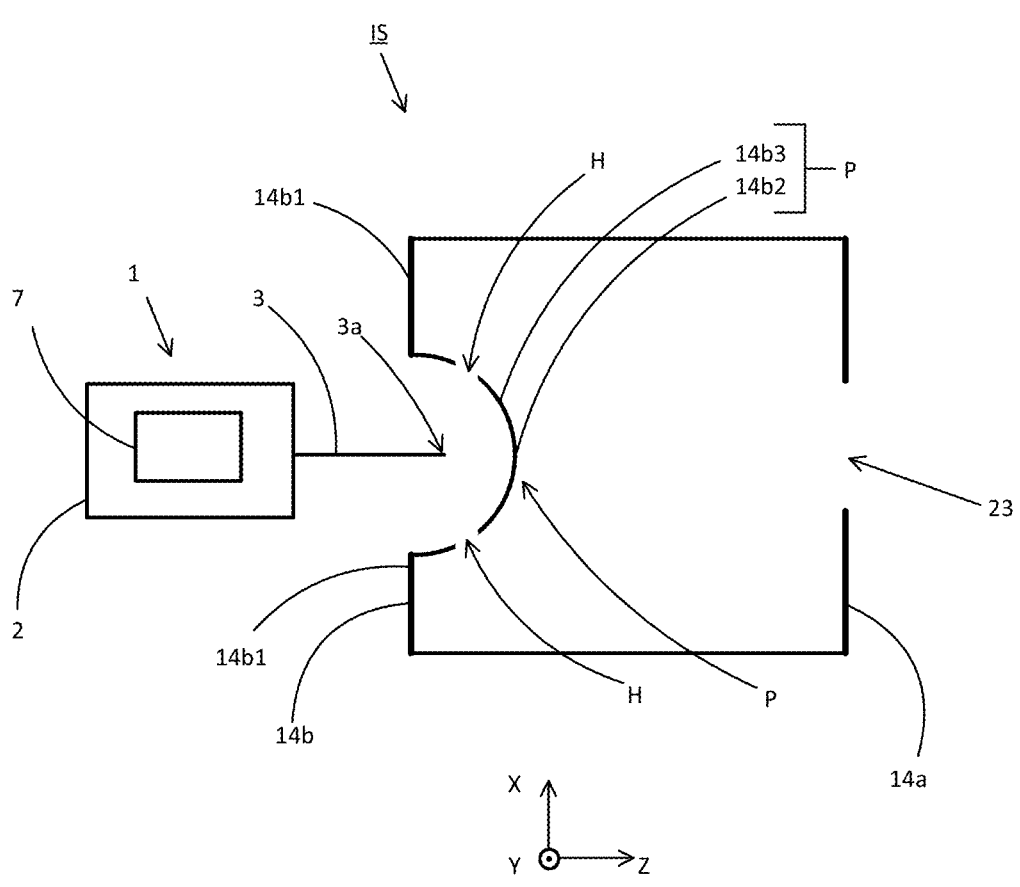

In some embodiments, the shape of the projection portion P may be such that the top portion is cut out from a conical or a triangular-pyramidal structure as shown in FIG. 7 and the cut portion may be closed with a lid, instead of the structure shown in FIG. 1 to FIG. 4. In some embodiments, the configuration may be a hemispherical shape as shown in FIG. 8. In the configuration of FIG. 8, the second portion 14b2 may be the apex of a hemisphere, and the entire region of the second portion 14b2 and the third portion 14b3 may be configured as a curved surface. On the other hand, as in FIG. 7, the second portion 14b2 may be made flat by cutting out the top portion (end portion on the first wall 14a side) of the hemispherical shape of FIG. 8 and closing the cut out portion.

Figure 9:
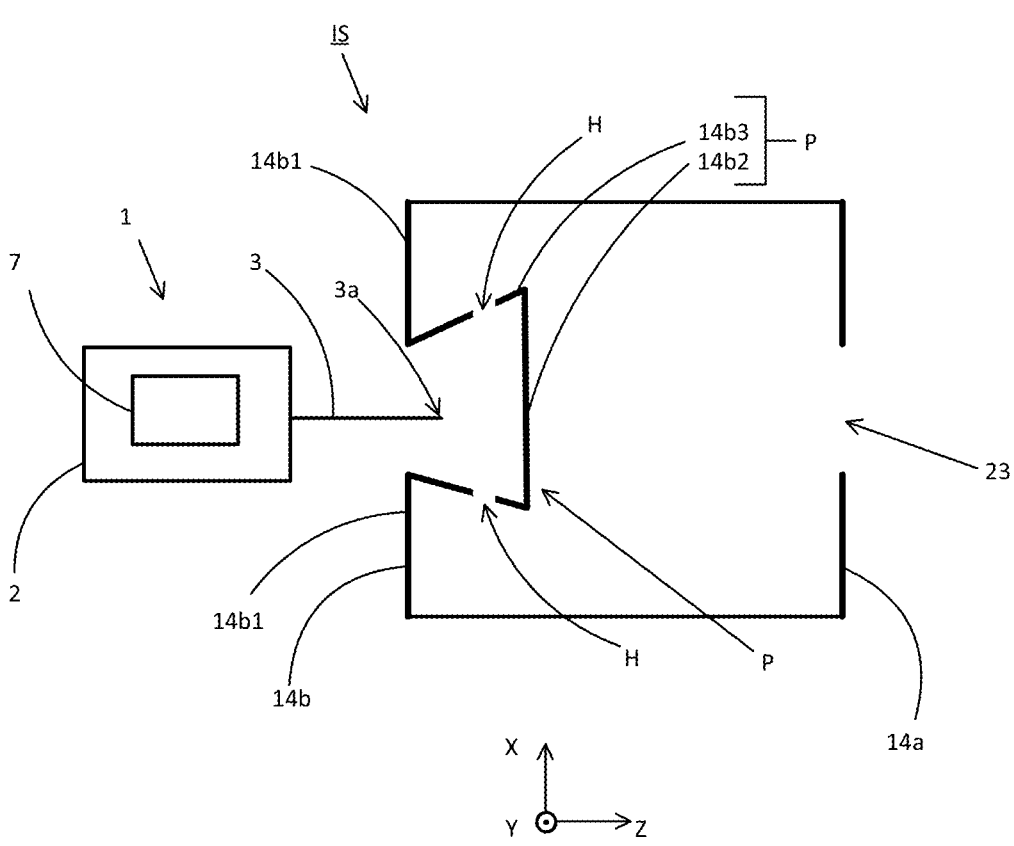
Figure 10:
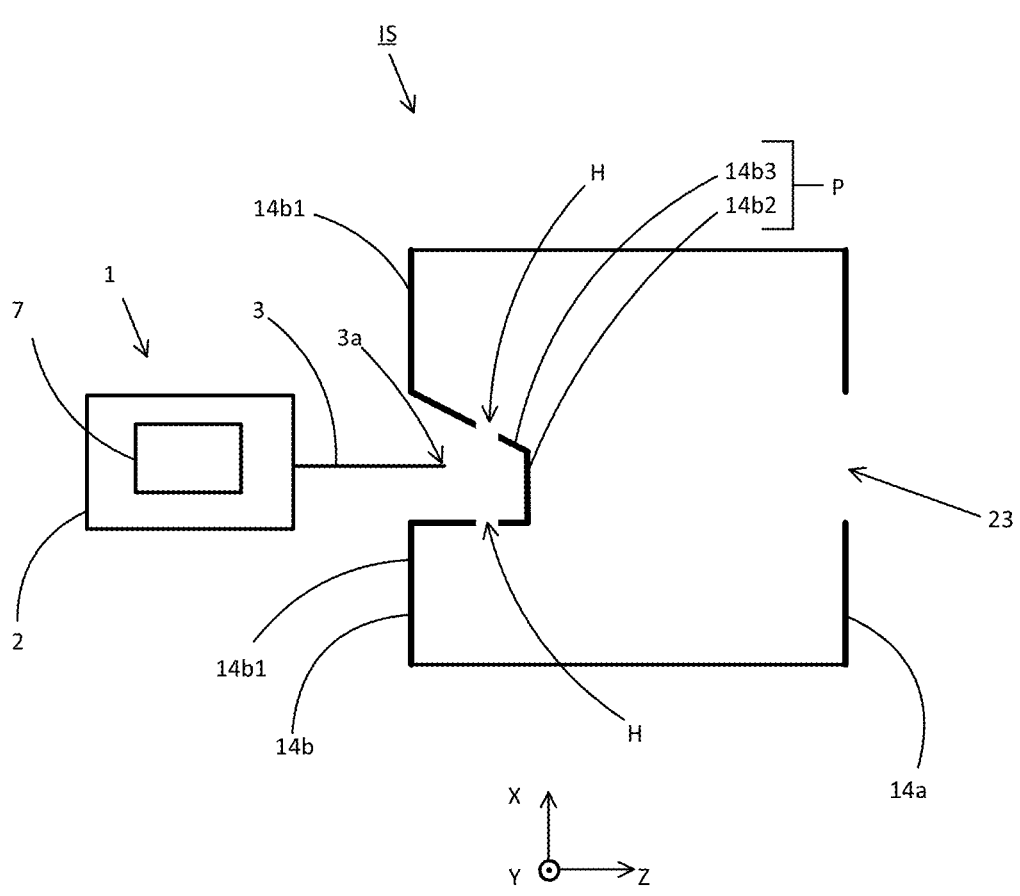

In some embodiments, as shown in FIG. 9, the projection portion P may be configured to spread toward the inside of the plasma generation chamber 14. In other words, the circumference of the projection portion P may increase as a distance from the second wall 14b increases. In some embodiments, as shown in FIG. 10, the projection portion P may be asymmetric in the X direction.

Figure 11:
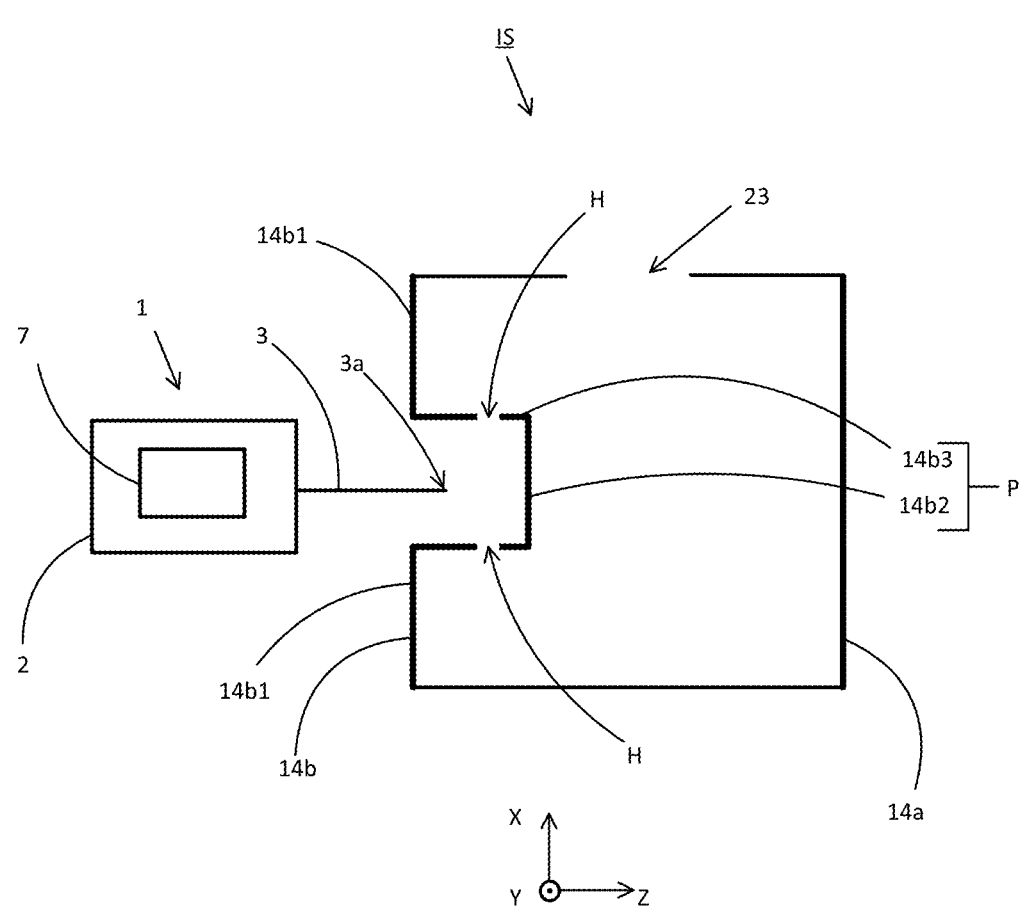
Figure 12:
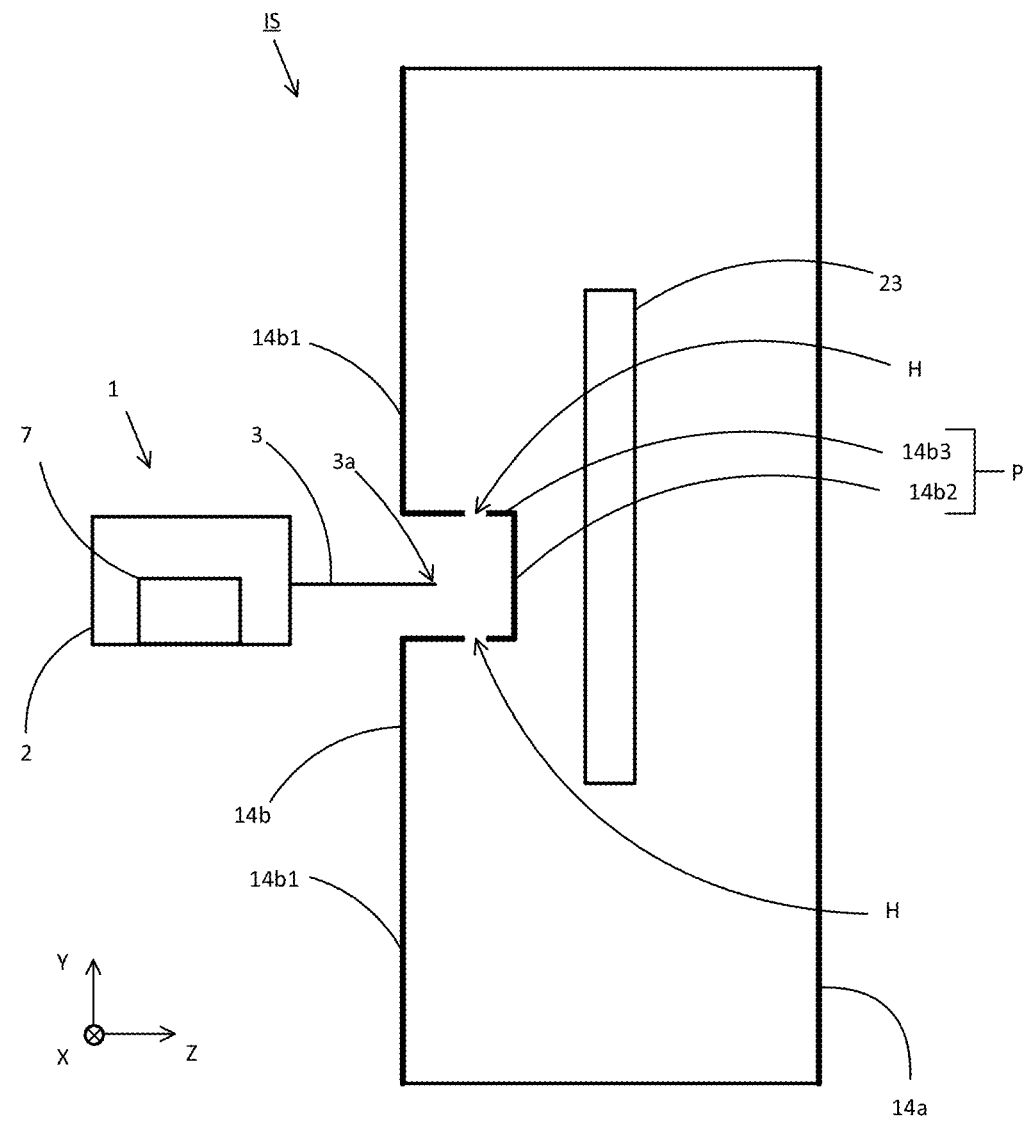
FIGS. 12-16 illustrate schematic cross-sectional views of examples of an ion source, according to various embodiments.

In the ion source IS shown in FIGS. 1-10, the ion extraction port 23 is formed in the first wall 14a of the plasma generation chamber 14. However, this is only an example. In some embodiments, as shown in FIG. 11, the ion extraction port 23 may be formed on a wall surface of the plasma generation chamber 14 in the X direction. See also FIG. 12 showing a cross-sectional view corresponding to FIG. 11, but taken along the Y-Z plane.

In FIG. 11, the aperture H is formed on the wall side where the ion extraction port 23 is formed, but the aperture H and the ion extraction port 23 are not opposed in the direction in which vapor from the aperture H is released. In other words, a location of ion extraction port 23 in the Z direction is not aligned with the location of the aperture H in the Z direction, but rather the positions are offset from each other. In the configuration shown in FIG. 11, the plasma generation efficiency is better than the configuration in which the aperture H and the ion extraction port 23 are directly opposite each other in the direction in which vapor from the aperture H is released.

The ion source IS shown in FIGS. 1-11 has a configuration in which vapor is released from a single vaporizer 1 into the plasma generation chamber 14. However, the number of vaporizers 1 is not limited to one, and in some embodiments, a plurality of vaporizers 1 may be used to supply vapor(s) to the plasma generation chamber 14. In this case, the kind of the vapor supplied from each vaporizer to the plasma generation chamber 14 may be the same or different.

The structure of the vaporizer 1 is not limited to the structure shown in FIG. 1. For example, the vaporizer 1 may be of a type in which a gas containing chlorine as a reactive gas is not introduced into the crucible 2. In such a vaporizer, the solid material 7 disposed in the crucible 2 is heated to directly vaporize the solid material 7, and the vapor is supplied to the plasma generation chamber 14. The solid material 7 is described by taking an aluminum-containing material as an example, but an appropriate solid material may be disposed in the crucible 2 depending on the ion species extracted from the ion source IS.

The structure for sealing a space between the vaporizer 1 and the plasma generation chamber 14 by elastically biasing the vaporizer 1 against the plasma generation chamber 14 has been described. The seal structure is not limited to such a configuration. For example, in some embodiments, the insulating member 21 shown in FIG. 1 may be screwed into the projection portion P and fixed thereto by fitting, thereby sealing the vaporizer 1 between the vaporizer 1 and the plasma generation chamber 14. In some embodiments, in the same manner, instead of the insulating member, the first nozzle 3 may be a double cylinder, the outer cylinder may be made longer than the inner cylinder, and the outer cylinder may be fixed to the plasma generation chamber 14, or the vaporizer 1 may be pressed against the plasma generation chamber 14 by using an elastic member to seal the space between the vaporizer 1 and the plasma generation chamber 14.

In some embodiments, in the vaporizer 1 shown in FIG. 1, when the material of the plasma generation chamber 14 is molybdenum, an aluminum alloy having a high melting point is generated in the opening H portion by a reaction between aluminum and molybdenum, and there is a possibility that the opening H is clogged. In order to prevent such clogging, the projection portion P or the entire plasma generation chamber 14 may be made of tungsten material.

The first portion 14b1, the second portion 14b2, and the third portion 14b3 of the second wall 14b of the plasma generation chamber 14 may be formed of the same member, or each portion may be formed of different members. For example, the second portion 14b2 and the third portion 14b3 may be formed of a single member, and the first portion 14b1 may be assembled with the single member consisting of the second portion 14b2 and the third portion 14b3.

Figure 13:
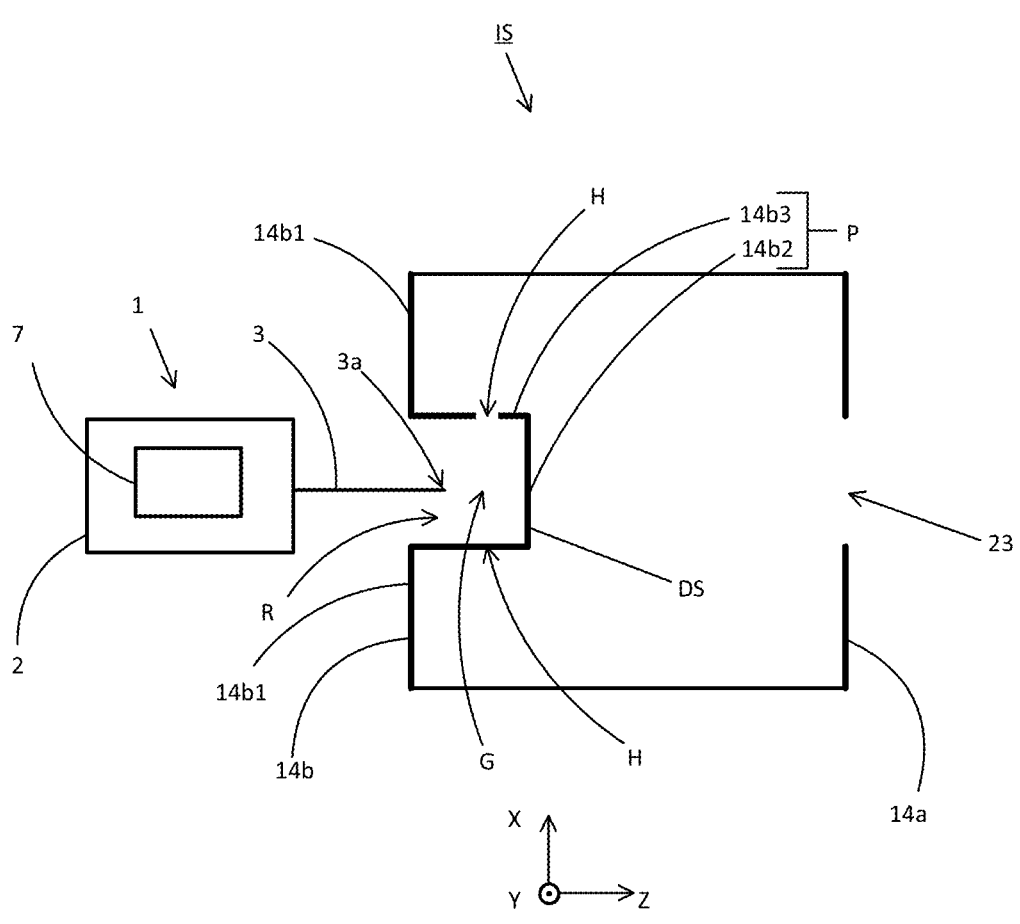
Figure 14:
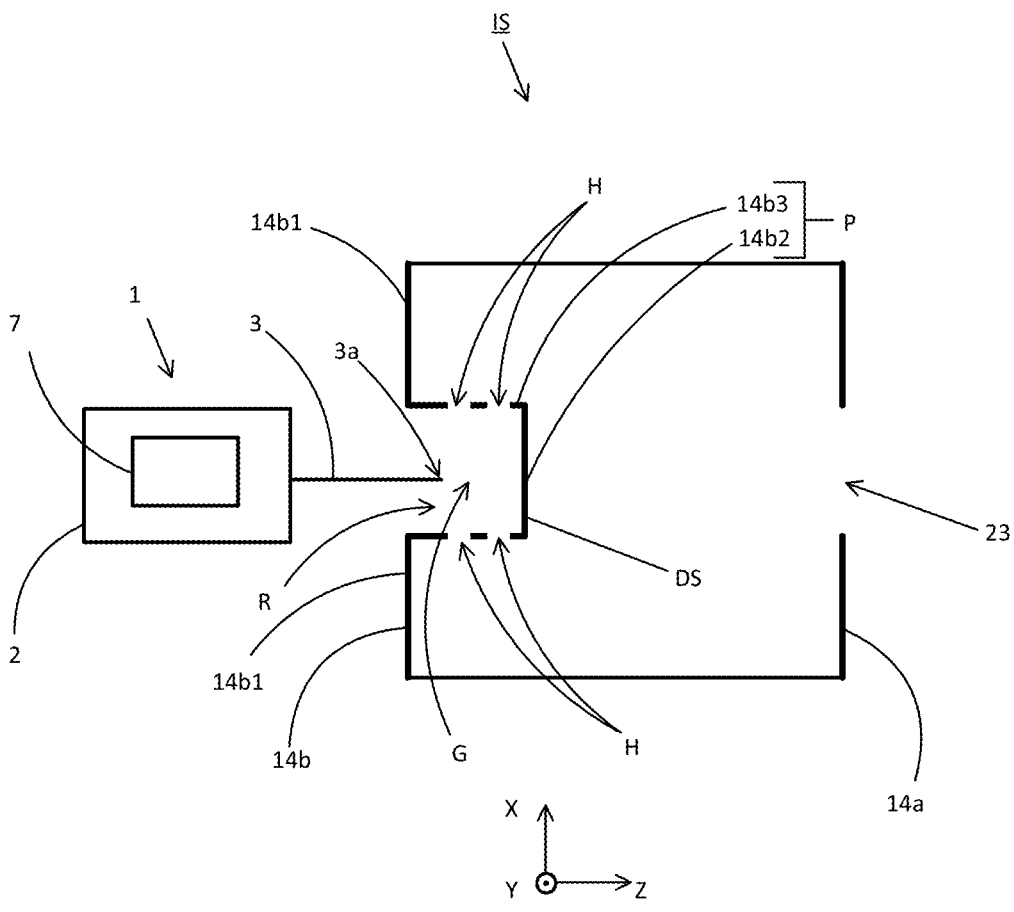
Figure 15:
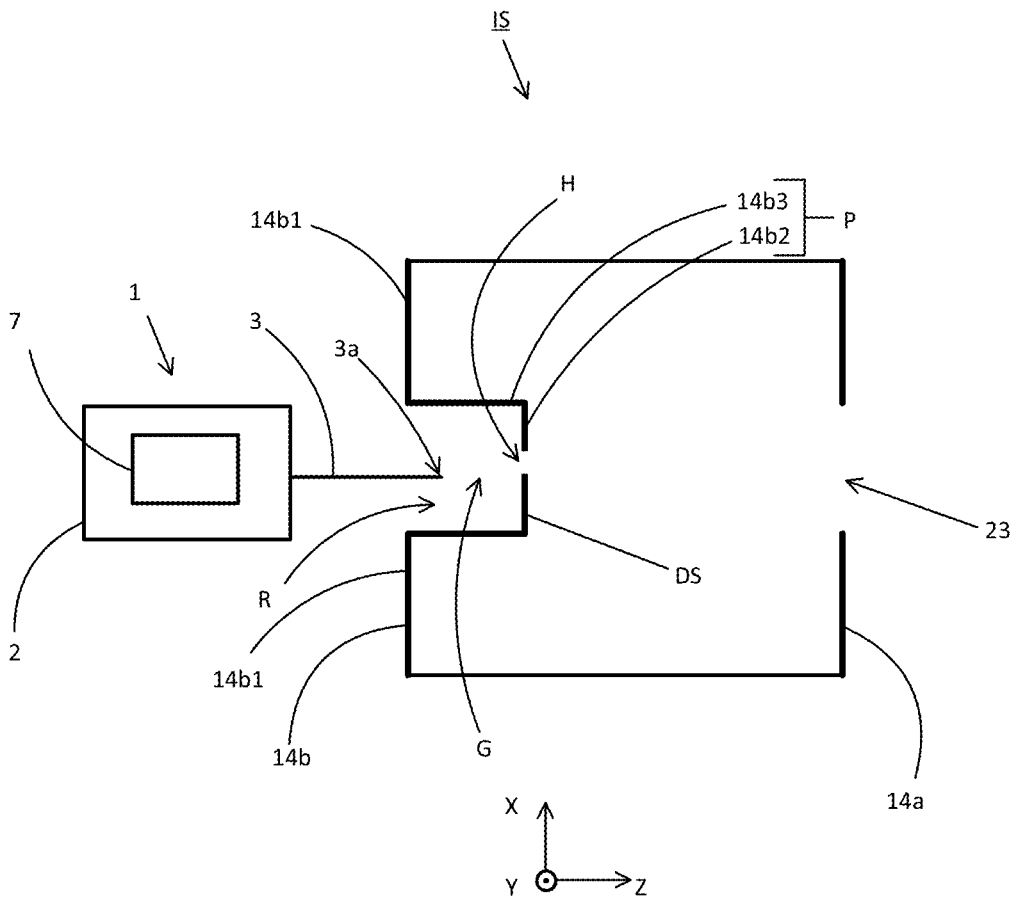
Figure 16:
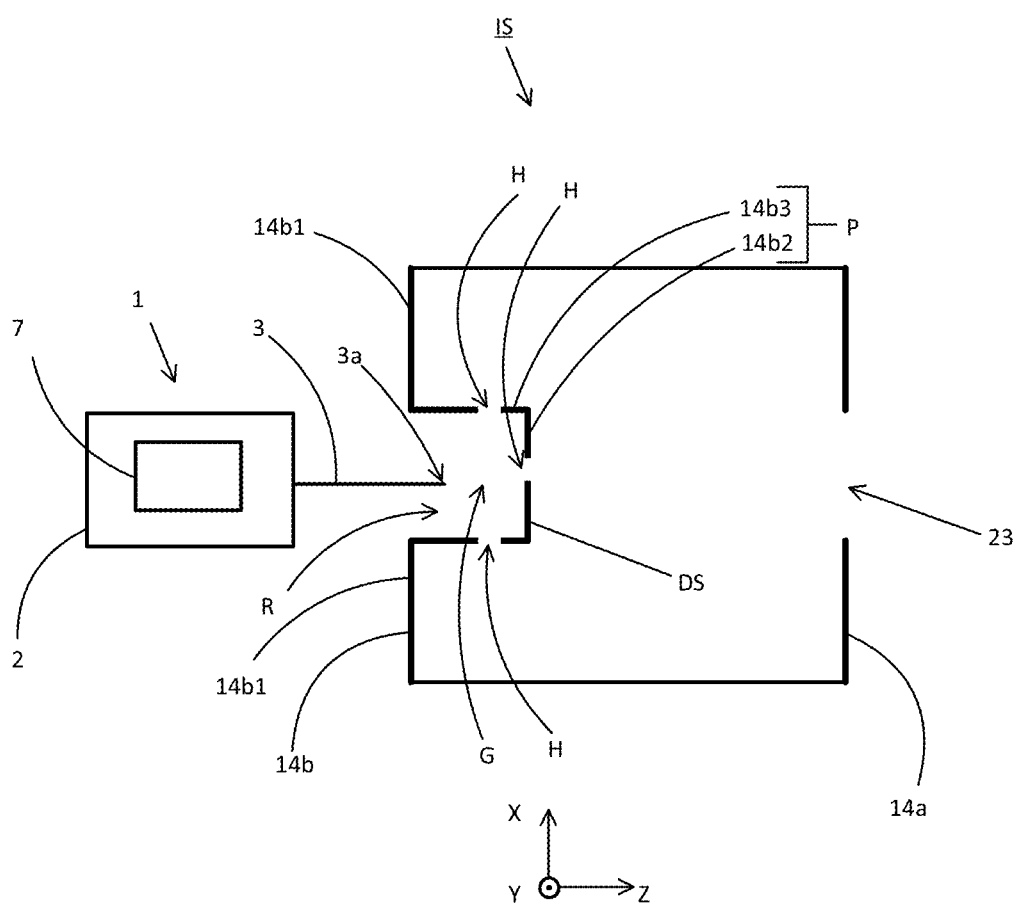

The number of the apertures H is not limited, and one aperture H as shown in FIG. 13 or three or more aperture H as shown in FIG. 14 may be provided. The aperture(s) H may be formed on the second portion 14b2 as shown in FIG. 15 or may be formed on both the second portion 14b2 and the third portion 14b3 as shown in FIG. 16.

It should be understood that embodiments are not limited to the various embodiments described above, but various other changes and modifications may be made therein without departing from the spirit and scope thereof as set forth in appended claims.

What is claimed is:

1. An ion source comprising:
a vaporizer comprising a nozzle for discharging vapor; and
a plasma generation chamber that receives the vapor from the vaporizer through the nozzle,
wherein:
the nozzle is located outside the plasma generation chamber,
the plasma generation chamber has a first wall and a second wall that is opposite to the first wall,
the second wall has a first portion and a second portion which are at different positions from each other in a direction from the first wall to the second wall, and a third portion provided between the first portion and the second portion, and
at least one of the second portion or the third portion has at least one aperture through which the vapor from the vaporizer enters into the plasma generation chamber.

2. The ion source as recited in claim 1, wherein the nozzle has an end portion for releasing the vapor,
the second portion and the third portion form a space at the outside of the plasma generation chamber; and
the end portion of the nozzle is disposed within the space.

3. The ion source as recited in claim 2, in the direction from the first wall to the second wall, the at least one aperture is spaced apart from the end portion of the nozzle.

4. The ion source as recited in claim 1, wherein the first wall has an ion extraction port.

5. The ion source as recited in claim 4, wherein the second portion is opposite to the ion extraction port in the direction from the first wall to the second wall.

6. The ion source as recited in claim 1, wherein the third portion is cylindrical and has the at least one aperture.

7. An ion source comprising:
a vaporizer configured to generate a vapor and comprising a nozzle for discharging the vapor; and
a plasma generation chamber that receives the vapor from the nozzle, wherein:
the nozzle is located outside the plasma generation chamber,
the plasma generation chamber has a first wall and a second wall that is opposite to the first wall,
the second wall has a projection portion that projects toward the first wall, and
the projection portion receives the nozzle and has at least one aperture through which the vapor is supplied into the plasma generation chamber.

8. The ion source as recited in claim 7, wherein the nozzle has an end portion, and wherein the projection portion defines a space that receives the end portion of the nozzle.

9. The ion source as recited in claim 8, wherein the at least one aperture is disposed in a wall of the projection portion at a position between a distal end of the end portion and a distal end of the projection portion.

10. The ion source as recited in claim 7, wherein the first wall has an ion extraction port.

11. The ion source as recited in claim 10, wherein the projection portion is disposed in the second wall at a position opposite to the ion extraction port.

12. The ion source as recited in claim 11, wherein the at least one aperture is provided in the projection portion at a location that does not face the ion extraction port.

13. An ion source comprising:
a vaporizer comprising a nozzle for discharging vapor; and
a plasma generation chamber comprising:
a first wall having an ion extraction port; and
a second wall that includes a projection portion that projects into the plasma generation chamber to form a recess in which an end portion of the nozzle is received, the second wall being opposite to the first wall in an axial direction of the nozzle,
wherein the projection portion comprises at least one aperture in fluid communication with an interior of the plasma generation chamber.

14. The ion source as recited in claim 13, wherein the projection portion comprises a cylindrical wall and a distal surface that together define the recess, and
the at least one aperture is provided in the cylindrical wall.

15. The ion source as recited in claim 14, wherein the at least one aperture is spaced apart from the distal surface of the projection portion.

16. The ion source as recited in claim 14, wherein the end portion is spaced apart from both the cylindrical wall and from the distal surface.

17. The ion source as recited in claim 14, wherein the end portion of the nozzle is spaced apart from the distal surface of the projection portion to form a gap therebetween, and the at least one aperture is disposed at a position in the cylindrical wall between the end portion and the distal surface, the position corresponding to the gap.

\* \* \* \* \*